United States Patent
Tatschl et al.

(10) Patent No.: US 7,323,870 B2
(45) Date of Patent: Jan. 29, 2008

(54) MAGNETORESISTIVE SENSOR ELEMENT AND METHOD OF ASSEMBLING MAGNETIC FIELD SENSOR ELEMENTS WITH ON-WAFER FUNCTIONAL TEST

(75) Inventors: David Tatschl, Villach (AT); Dirk Hammerschmidt, Villach (AT); Juergen Zimmer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/360,315

(22) Filed: Feb. 23, 2006

(65) Prior Publication Data

US 2006/0202692 A1    Sep. 14, 2006

(30) Foreign Application Priority Data

Feb. 23, 2005  (DE) ............... 10 2005 008 368
Oct. 4, 2005    (DE) ............... 10 2005 047 413

(51) Int. Cl.
  *G01R 33/02*   (2006.01)
(52) U.S. Cl. .............. 324/252; 324/224; 324/263
(58) Field of Classification Search ............... 324/252, 324/207.21, 224, 263, 226, 225
See application file for complete search history.

(56) References Cited

U.S. PATENT DOCUMENTS

| | | | |
|---|---|---|---|
| 5,247,278 A | 9/1993 | Pant et al. | 338/32 R |
| 5,521,501 A | 5/1996 | Dettmann et al. | 324/252 |
| 5,561,366 A * | 10/1996 | Takahashi et al. | 324/117 R |
| 5,677,625 A * | 10/1997 | Dieny | 324/252 |
| 5,686,837 A * | 11/1997 | Coehoorn et al. | 324/252 |
| 5,952,825 A * | 9/1999 | Wan | 324/252 |
| 6,069,476 A | 5/2000 | Vieux-Rochaz et al. | 324/252 |
| 6,114,850 A * | 9/2000 | Hayashi | 324/252 |
| 6,173,501 B1 * | 1/2001 | Blank et al. | 33/356 |
| 6,329,818 B1 * | 12/2001 | Tokunaga et al. | 324/252 |
| 6,946,834 B2 * | 9/2005 | Van Zon et al. | 324/252 |
| 2005/0038623 A1 | 2/2005 | Hamerschmidt | 702/118 |

FOREIGN PATENT DOCUMENTS

| | | |
|---|---|---|
| DE | 41 21 374 A1 | 1/1993 |
| DE | 43 18 716 A1 | 12/1994 |
| DE | 43 19 146 A1 | 12/1994 |
| DE | 195 20 206 A1 | 12/1996 |
| DE | 198 10 218 A1 | 10/1998 |
| DE | 198 10 838 A1 | 9/1999 |
| DE | 102 20 911 A1 | 12/2003 |
| DE | 103 37 045 A1 | 3/2005 |
| DE | 102004032483 A1 | 1/2006 |
| EP | 0 544 479 A2 | 11/1992 |
| JP | 05-036805 | 2/1993 |
| WO | 98/48291 | 3/1998 |

* cited by examiner

*Primary Examiner*—Jay M Patidar
(74) *Attorney, Agent, or Firm*—Eschweiler & Associates, LLC

(57) ABSTRACT

A method of performing an on-wafer function testis provided for multiple magnetic field sensor elements on a wafer. Each sensor element includes a magnetic-field-sensitive structure and a current conductor structure. The current conductor structure provides a test magnetic field in response to a test signal, and a change in an electrical characteristic of the respective magnetic-field-sensitive structure is sensed. The functionality of the respective magnetic field sensor element is then evaluated based on electrical characteristic change.

14 Claims, 9 Drawing Sheets

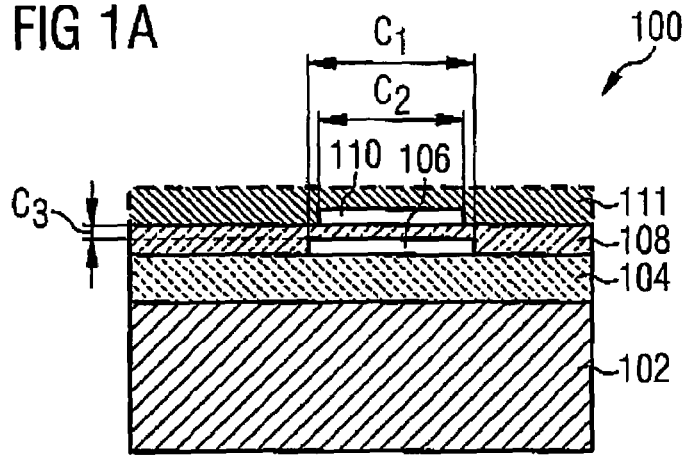
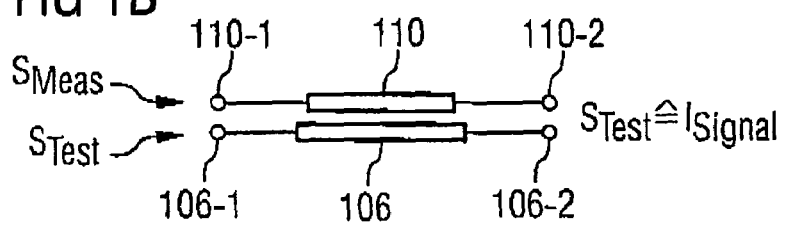
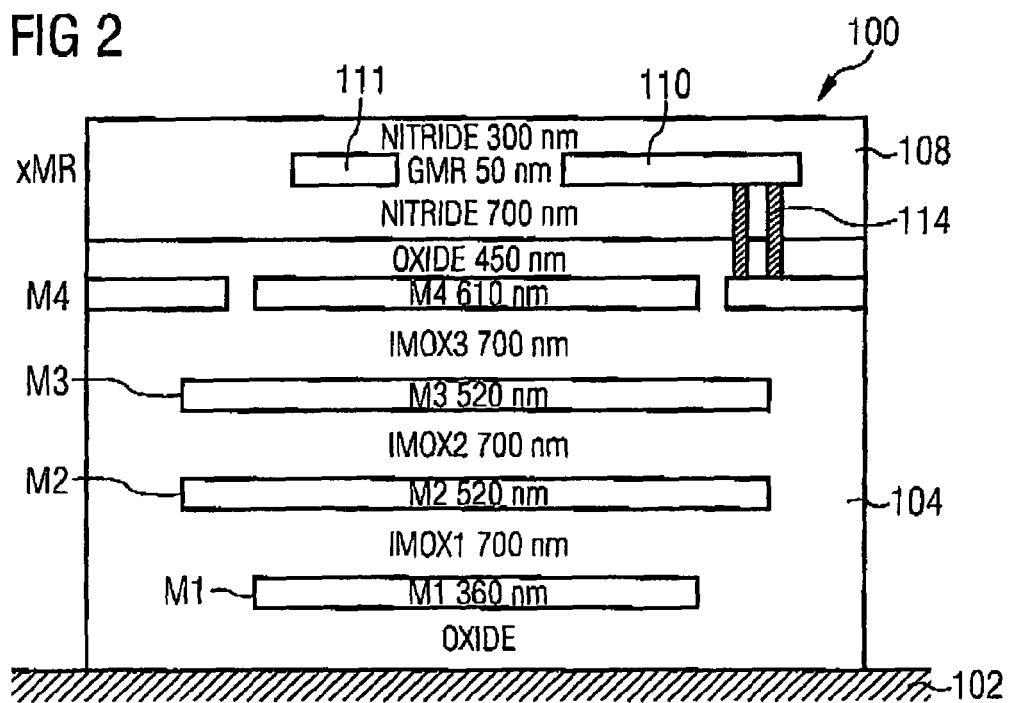

FIG 3A
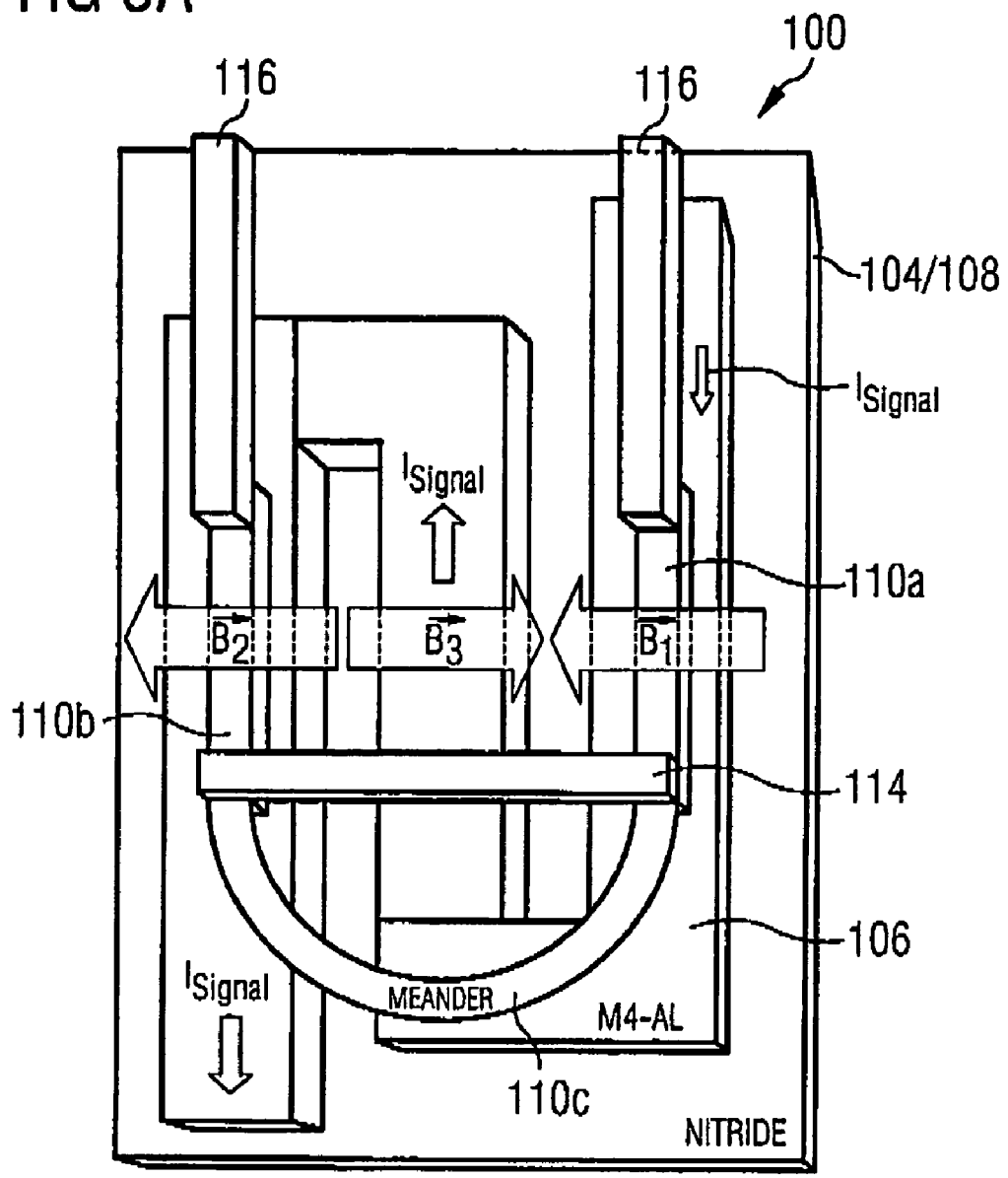
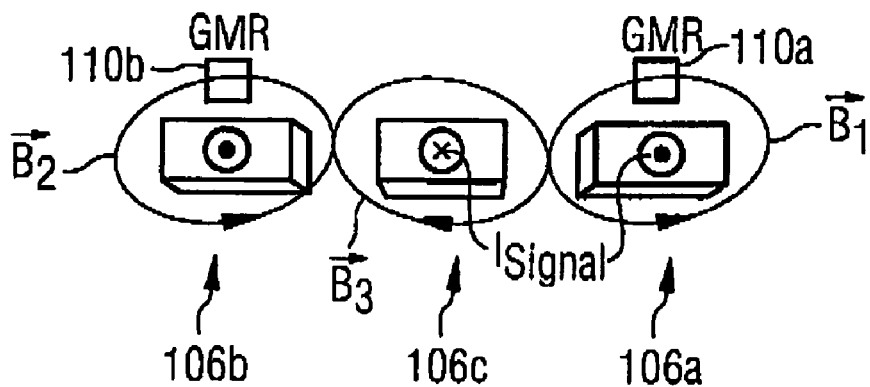

FIG 3B
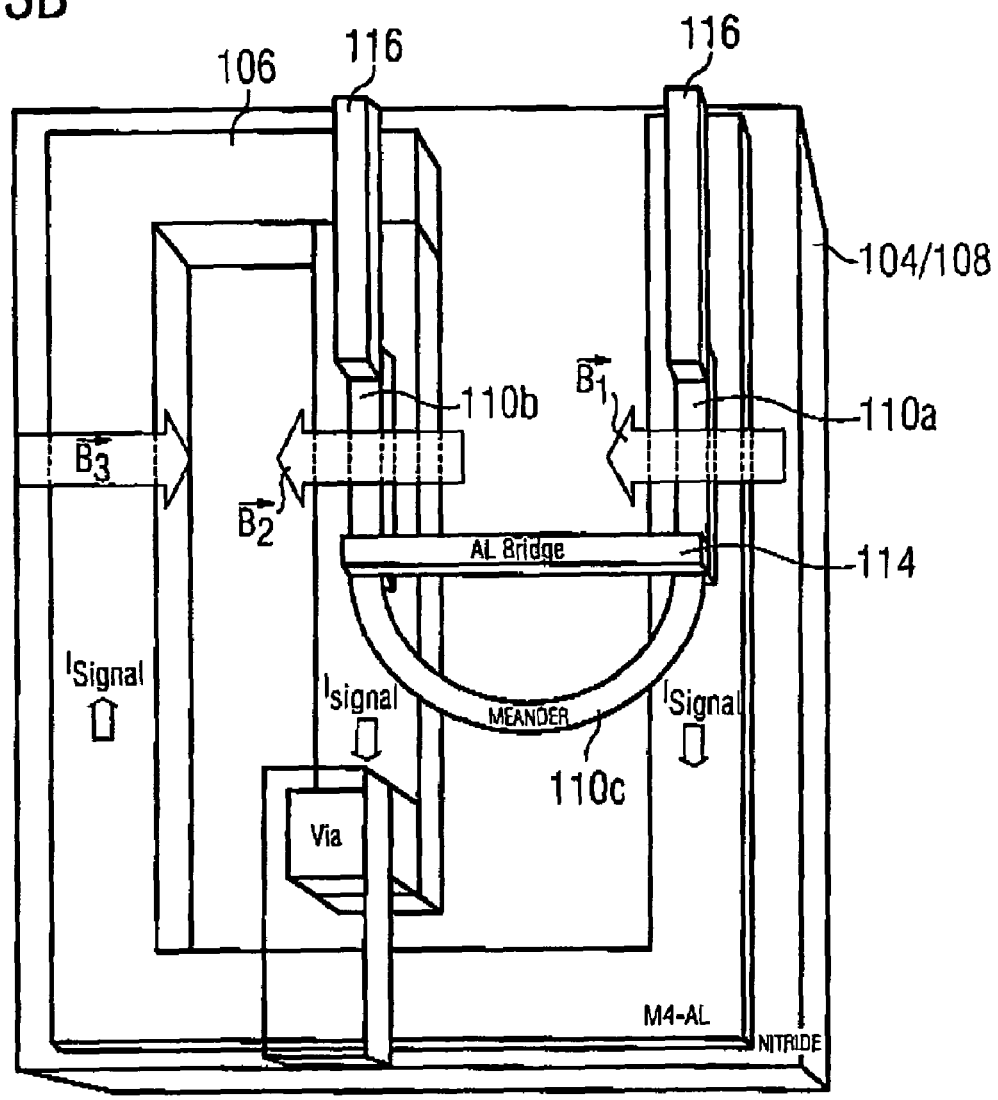
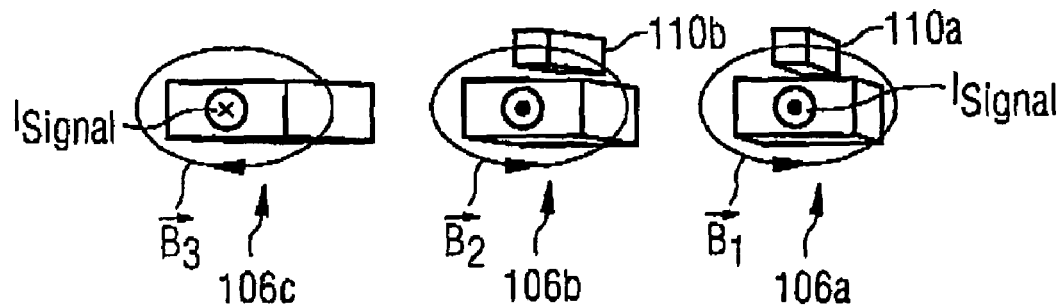

FIG 3C
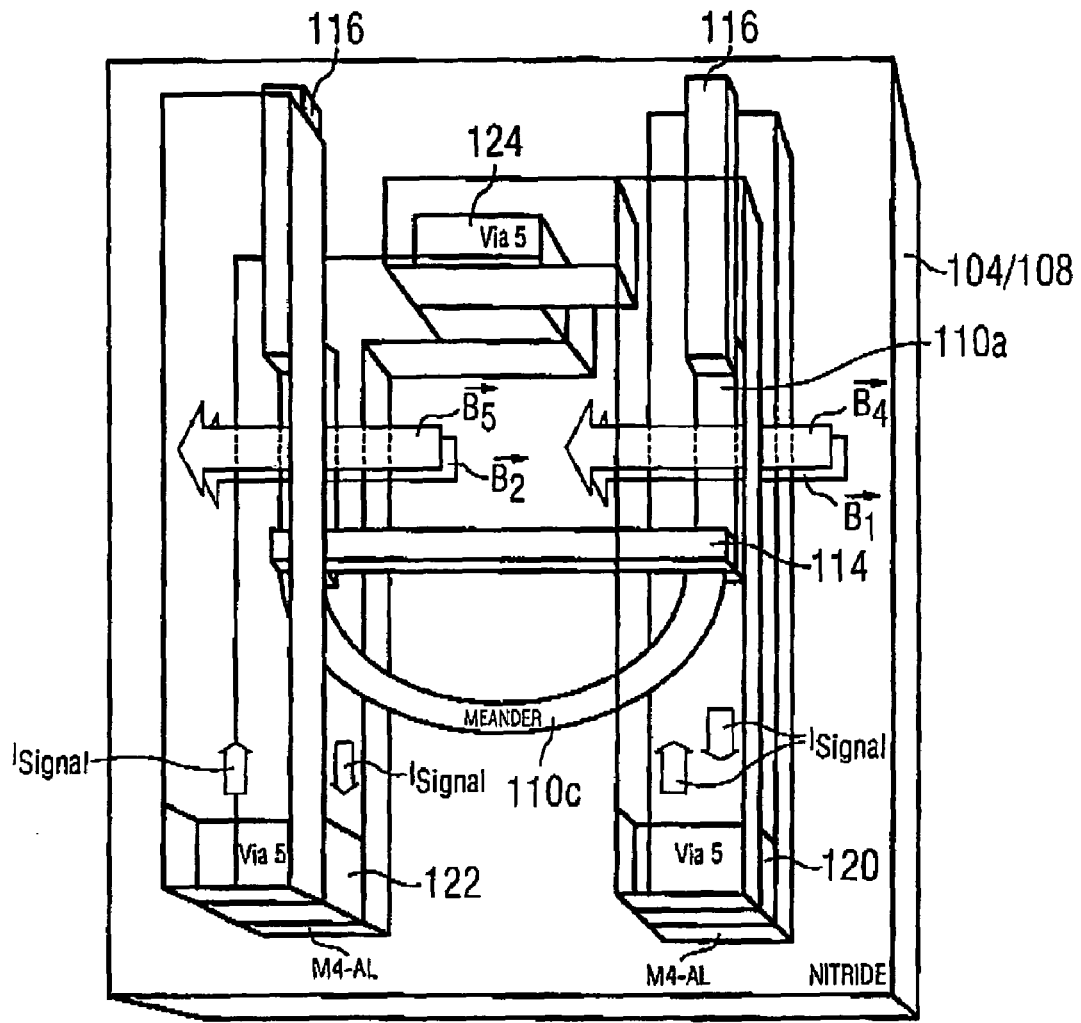
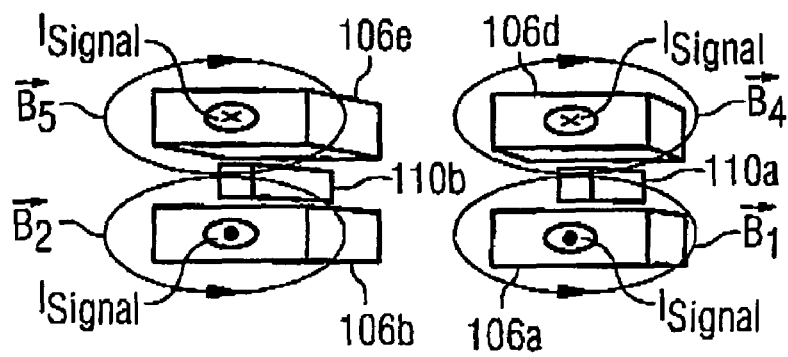
⊗ $I_{Signal}$ → INTO DRAWING PLANE
⊙ $I_{Signal}$ → OUT OF DRAWING PLANE

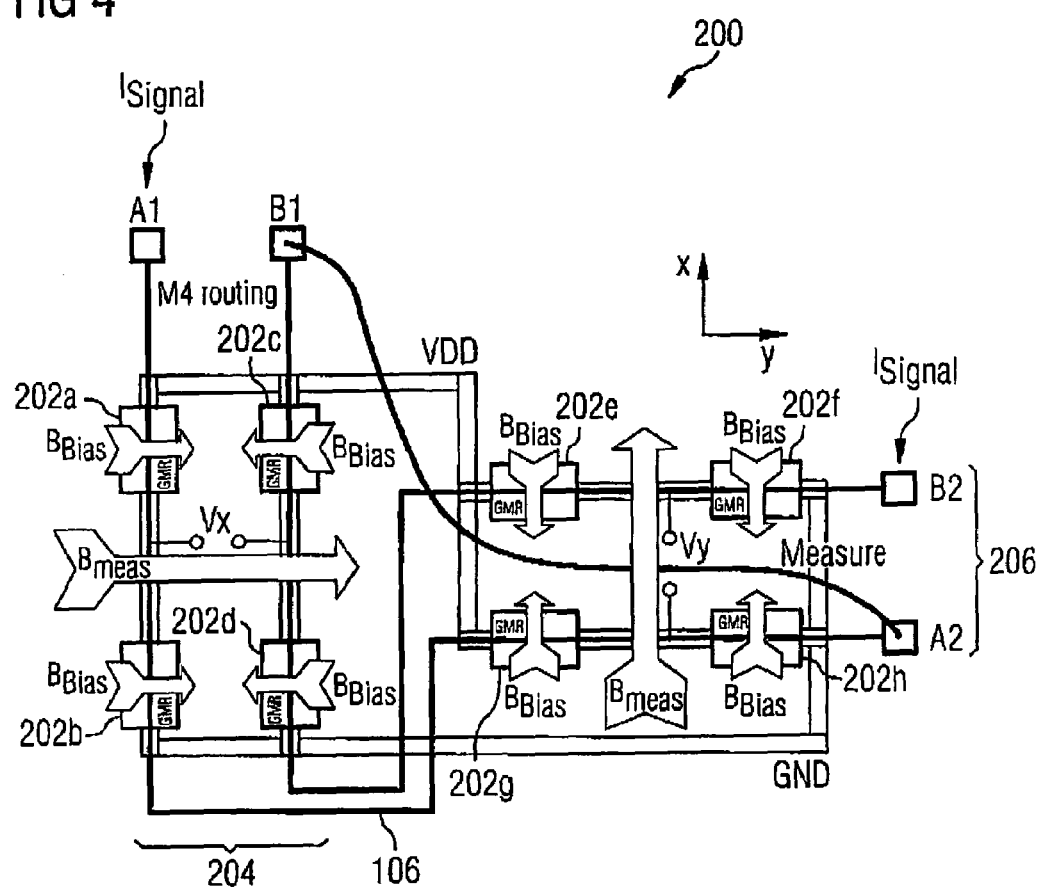

MAGNETORESISTIVE SENSOR ELEMENT AND METHOD OF ASSEMBLING MAGNETIC FIELD SENSOR ELEMENTS WITH ON-WAFER FUNCTIONAL TEST

CROSS-REFERENCE TO RELATED APPLICATIONS

This application claim priority from German Patent Application No. 10 2005 008 368.4, which was filed on Feb. 23, 2005 and German Patent Application No. 10 2005 047 413.6, which was filed on Oct. 4, 2005 and is incorporated herein by reference in its entirety.

TECHNICAL FIELD

The present invention relates to magnetoresistive sensor elements and, in particular, to a concept for manufacturing and testing magnetoresistive sensor elements or arrangements with a plurality of magnetoresistive sensor elements.

BACKGROUND

Magnetoresistive devices or sensor elements, which may also be arranged as single elements or also in form of a plurality of interleaved single elements, are employed in numerous applications for contact-free position and/or movement detection today, such as movement direction, rotation direction, rotation speed, velocity of a giver object with reference to the sensor arrangement. Rotation angle sensors are increasingly applied for contact-free detection of rotations of a giver object with reference to a sensor arrangement, particularly in automobile technology, such as for ABS systems, systems for traction control, etc. To this end, rotation angle sensors are often employed on the basis of magnetoresistive elements, such as GMR (giant magnetoresistance) elements, wherein GMR elements are substantially characterized by a permanently magnetizable layer of GMR material.

This permanently magnetizable layer has an electrical characteristic dependent on a magnetic field present, i.e. the resistivity of a GMR layer of a GMR device is influenced by an impacting external magnetic field. In bridge arrangement, rotation angle sensors on the basis of the GMR effect may provide inherent 360° uniqueness of the magnetic field to be sensed and have relatively high sensitivity with reference to the magnetic field to be sensed.

In order to realize 360° detection by means of a magnetoresistive structure out of a plurality of magnetoresistive devices, to detect the rotation direction of a wheel or a shaft with reference to the center arrangement, for example, eight magnetoresistive devices are connected with two Wheatstone bridge arrangements (connected in parallel), wherein one of the bridge circuits has reference magnetizations oriented perpendicularly to those of the other bridge circuit. Within each bridge circuit out of four magnetoresistive devices, the reference magnetizations are arranged in anti-parallel manner, so that both bridge circuits provide sinusoidal signals dependent on the rotation angle of an external magnetic field, which are 90° phase-shifted with respect to each other. Via an arctan computation of both output signals, i.e. the output signal of the first and second bridge circuits, the angle over a 360° range can be uniquely determined.

A circuit diagram of a possible connection in form of a double bridge circuit 500 with eight magnetoresistive magnetic field sensor elements is illustrated in FIG. 9. The double bridge arrangement 500 includes a first bridge circuit arrangement 502 and a second bridge circuit arrangement 504, each out of four magnetoresistive single elements 502a-b, 504a-b, the magnetizations of which are indicated with reference to the x-axis and y-axis illustrated in FIG. 9. The first bridge circuit 502 includes two magnetoresistive devices 502a with permanent magnetization antiparallel to the x-axis indicated and two magnetoresistive devices 502b with permanent magnetization parallel to the x-axis. The double bridge circuit arrangement 500 further includes a second bridge circuit 504 comprising two magnetoresistive devices 504a with permanent magnetization in the y direction and two magnetoresistive devices 504b with permanent magnetization antiparallel to the y direction each. The individual magnetoresistive devices 502a, 502b, 504a, 504b are connected, as indicted in FIG. 9, wherein the first and second bridge circuits 502 and 504 are connected to each other in parallel and further connected between a supply voltage and a ground potential.

During the operation of the magnetoresistive sensor arrangement 500 of FIG. 9, the first bridge circuit 502 provides an output signal $V_X$ between the two center taps of the first bridge circuit, the second bridge circuit 404 providing an output signal $V_Y$ between the two center taps of the second magnetoresistive bridge circuit. The connection of the magnetoresistive devices 502a, b and 504a, b described with reference to FIG. 9, allows for the detection of an external, rotating magnetic field over an angle range of 360°. As a function of the rotating, external magnetic field, the sinusoidal output signals $V_X$ and $V_Y$ of the two bridge circuits connected in parallel are obtained, wherein the two output signals $V_X$ and $V_Y$ are each phase-shifted by an angle of 90° with respect to each other.

So as to now characterize the magnetoresistive sensor arrangement 500 illustrated in FIG. 9 as double bridge circuit with a plurality of magnetoresistive single elements with reference to its function parameters, the magnetoresistive sensor arrangement 500 to be examined has to be subjected to a substantially homogeneous test magnetic field. To this end, all materials and arrangements in proximity to the magnetoresistive sensor arrangement, i.e. also the circuit substrate or the sensor wafer of the magnetoresistive sensor arrangement, must have non-magnetic properties so as not to inadvertently influence the homogeneity of the test magnetic field. Moreover, the positioning of the magnetoresistive sensor wafer of the chip package on which or in which the magnetoresistive sensor arrangement to be tested is accommodated goes into the accuracy of the measurement for the characterization of the function parameters of the magnetoresistive sensor arrangement 500.

In the following, it will now be briefly gone into two different procedures for the characterization or examination of magnetoresistive sensor arrangements. In principle, it is distinguished between testing individual circuit chips by means of a laboratory set-up and testing a plurality of magnetoresistive sensor arrangements on a sensor wafer by means of a test apparatus or tester, such as a needle tester.

In a typical laboratory set-up for the examination of a magnetoresistive circuit chip with a magnetoresistive circuit arrangement, the circuit chip is clamped into a non-magnetic fixture, which is in turn mounted into an external test magnetic field as homogeneous as possible. The non-magnetic fixture, the energy supply, and further apparatus in the test magnetic field in the surrounding of the circuit chip to be examined have to be non-magnetic or must not cause influence on the test magnetic field. For the generation of the homogeneous test magnetic field, for example, two stationary mounted magnetic field coils are used, which can generate the test magnetic fields with a magnetic field strength of up to several Tesla. The homogeneous test magnetic field may, however, also be generated by permanent magnets, but these having strong temperature dependency of the test magnetic field provided, which is why permanent magnets are not suited for temperature measurements, i.e. for the detection of the dependence of the sensor behavior over the temperature. Furthermore, it is to be noted that the quantity of the external test magnetic field is assumed as known and must not change over a test series.

In the characterization of magnetoresistive circuit arrangements on a magnetoresistive sensor wafer by means of a tester, the tester used and the entire test set-up have to be adapted to the respective magnetoresistive circuit arrangements to be examined. Thus, it is required to generate an external test magnetic field as homogeneous as possible, which is here also generated by the employment of magnetic coils or of permanent magnets. In a tester construction, the materials within the test magnetic field also have to be non-magnetic or must not cause influence on the test magnetic field. Furthermore, it is to be noted that in such a tester construction the positioning of the wafer with the magnetoresistive sensor arrangement to be examined also has to be exactly correct with respect to the reference angle of the test magnetic field.

After adjusting the external magnetic field and adjusting the orientation of the magnetoresistive sensor wafer with the reference field direction, according to the prior art, the angle measurement by means of the magnetoresistive sensor arrangement attached on the sensor wafer now begins, as it is illustrated in FIG. 9. To this end, the needle card (tester) contacts the sensor wafer, wherein the tester senses the bridge output signals $V_X$, $V_Y$ of the magnetoresistive sensor arrangement 500 arranged in a double bridge circuit. By means of the sensed sensor bridge output signals $V_X$, $V_Y$, the function parameters of the magnetoresistive sensor arrangement to be examined are then determined for the qualification of the magnetoresistive sensor arrangements. The function parameters determined include, for example, the magnetoresistive effect, the amplitude synchronism, an offset signal, orthogonality errors, temperature coefficients, as wells as anisotropy and hysteresis errors, etc.

The known procedures previously explained for the examination of the function parameters of magnetoresistive sensor arrangements are disadvantageous particularly in that the tester or the tester set-up has to be adapted or rebuilt for the examination of the magnetoresistive sensor wafer, wherein it is to be noted that a similarly intensive configuration is required for laboratory measurements. These intensive requirements for examining a magnetoresistive sensor wafer or circuit chip with magnetoresistive sensor arrangements cause relatively high manufacturing costs of the same due to the required calibration steps and the relatively high number of measurement steps in the examination of magnetoresistive circuit arrangements or sensor arrangements.

As already indicated above, at least two magnetic field directions are employed for the characterization of the magnetoresistive circuit arrangements, wherein the test magnetic fields are generated with permanent magnets or coil arrangements. Although the permanent magnets may be mounted relatively easily for the test set-up, it is particularly disadvantageous that the test magnetic field obtained from permanent magnets is temperature-dependent and the permanent magnets have to be rotated in order to obtain the second magnetization direction for the test magnetic field. This rotating of the permanent magnets requires a lot of time in the examination of the magnetoresistive circuit arrangement and is also sensibly employable only as laboratory variant.

Although the current directions may be switched relatively easy with the employment of magnetic coils, it is extremely disadvantageous here that the switching of the magnetic coils requires a relatively long time duration until the inductive test magnetic field has settled.

The German patent application DE 10220911 A1, for example, describes a method for performing a function test of at least one magnetic, particularly magnetoresistive sensor element integrated in a circuit arrangement of equipment during the operation of the circuit arrangement or the equipment, wherein the sensor element is periodically or non-periodically imparted with a magnetic field generated by a magnetic field generation means associated with the sensor element.

SUMMARY

Starting from this prior art, it is an object of the present invention to provide an improved magnetoresistive device or magnetic field sensor element and a manufacturing method thereof, in order to enable the magnetoresistive device to be tested without additional external measurement set-up, and a functional verification thereof to be performed preferably already on wafer level.

In accordance with a first aspect, the present invention provides a method of performing an on-wafer function test on a plurality of magnetic field sensor elements arranged on a wafer, wherein each magnetic field sensor element has a magnetic-field-sensitive structure and a current conductor structure associated with the magnetic-field-sensitive structure, wherein the magnetic-field-sensitive structure has a magnetic-field-dependent electrical characteristic, and wherein the current conductor structure is formed to generate a predetermined test magnetic field component in the associated magnet-sensitive structure, with the steps of: providing a substrate with the magnetic field sensor elements; testing each magnetic-field-sensitive structure of the magnetic field sensor elements by generating a test signal through the current conductor structure, to generate the predetermined test field magnetic field component in the magnetic-field-sensitive structure; sensing a change in the electrical characteristic of the magnetic-field-sensitive structure due to the test magnetic field component; and evaluating the functionality of the magnetic field sensor element, based on the sensed change in the electrical characteristic of the magnetic-field-sensitive structure.

In accordance with a second aspect, the present invention provides a method of manufacturing magnetic field sensor elements with on-wafer function test, with the steps of: providing a substrate; arranging a plurality of permanently magnetizable magnetic field sensor structures on the substrate, wherein the permanently magnetizable magnetic field sensor structures have a magnetization minimum temperature; arranging a plurality of current conductor structures on the substrate, so that a current conductor structure is associated with each permanently magnetizable magnetic field sensor structure; generating local, permanent magnetization in each magnetic field sensor structure by heating the permanently magnetizable magnetic field sensor structure to a temperature value above the magnetization minimum temperature; and generating a magnetization signal in the current conductor structure, to effect a defined magnetization magnetic field component in the permanently magnetizable sensor structure, so that permanent, local magnetization of the magnetic field sensor structure arises and the magnetic field sensor element with the permanently magnetized magnetic field sensor structure has a magnetic-field-dependent electrical characteristic; testing each magnetic-field-sensitive structure of the magnetic field sensor elements by generating a test signal through the current conductor structure, to generate a predetermined test magnetic field component in the magnetic-field-sensitive structure; sensing a change in the electrical characteristic of the magnetic field sensor structure due to the test magnetic field component; and evaluating the functionality of the magnetic field sensor element based on the sensed change in the electrical characteristic of the magnetic field sensor structure.

In accordance with a third aspect, the present invention provides a magnetic field sensor element, having: a permanently magnetizable magnetic field sensor structure with a first and a second sensor element contact, wherein the permanently magnetizable magnetic field sensor structure has permanent magnetization, and wherein a magnetic-field-dependent electrical characteristic of the magnetic field sensor structure can be sensed via the sensor element contacts, and a current conductor structure with a first and a second current conductor contact, wherein the current conductor structure is formed so that a magnetization signal can be applied between the first and the second contact, to obtain a defined magnetization magnetic field component in the magnetic field sensor structure, in order to effect permanent, local magnetization of the magnetic field sensor structure, and so that also a test signal can be applied between the current conductor contacts, to obtain a defined test magnetic field component in the magnetic field sensor structure.

The present invention is based on the finding of manufacturing a magnetoresistive circuit arrangement or sensor arrangement, such as a single magnetoresistive device or arrangement with a plurality of resistive devices, so that the magnetoresistive sensor element, such as a magnetic field sensor element, has a permanently magnetizable magnetic field sensor structure and an associated current conductor structure, wherein the current conductor structure is formed so to be able to apply a test signal in the current conductor structure to obtain a defined test magnetic field component in first and second directions in the magnetic field sensor structure, so that a change in an electrical characteristic of the magnetic-field-sensitive structure can be sensed due to the test magnetic field component, preferably via the magnetoresistive effect, in order to be able to evaluate the functionality of the magnetic field sensor element based on the detected change in the electrical characteristic of the magnetic-field-sensitive structure. Optionally, the current conductor structure may further be formed so that a magnetization signal can be applied thereto in order to obtain a defined magnetization magnetic field component in the associated magnetic field sensor structure so as to effect permanent, local magnetization of the magnetic field sensor structure.

By the inventive magnetic field sensor element or the inventive concept for manufacturing and testing or examining the same, it is made possible that the testing and the functional verification of a magnetoresistive sensor element or a magnetoresistive sensor arrangement can particularly already be performed on wafer level without additional external set-up for the test magnetic field generation, wherein quick switching of the test magnetic field directions is also enabled, so that particularly also the prerequisites for online testing of a magnetoresistive sensor element or a magnetoresistive sensor structure may be provided during the operation in the build-in state thereof. Optionally, the inventive magnetic field sensor element is further formed so that, with the current conductor structure associated with the permanently magnetizable magnetic field sensor structure, the so-called inscription process for a local, permanent magnetization of the magnetoresistive magnetic field sensor element may also be done, without having to provide additional external provisions and manufacturing set-ups.

BRIEF DESCRIPTION OF THE DRAWINGS

These and other objects and features of the present invention will become clear from the following description taken in conjunction with the accompanying drawings, in which:

FIGS. 1a-b show a schematic cross-sectional illustration through a magnetoresistive device according to an embodiment of the present invention and a simple, accompanying electric equivalent circuit diagram;

FIG. 2 shows a possible realization in vertical integration of the inventive magnetoresistive sensor device with a metal layer stack;

FIGS. 3a-c show a schematic illustration of exemplary embodiments of the inventive (magnetoresistive) magnetic field sensor element;

FIG. 4 shows a schematic illustration of an exemplary connection of a plurality of magnetic field sensor elements arranged in a double bridge circuit, according to the present invention;

DETAILED DESCRIPTION

Figure 5A:
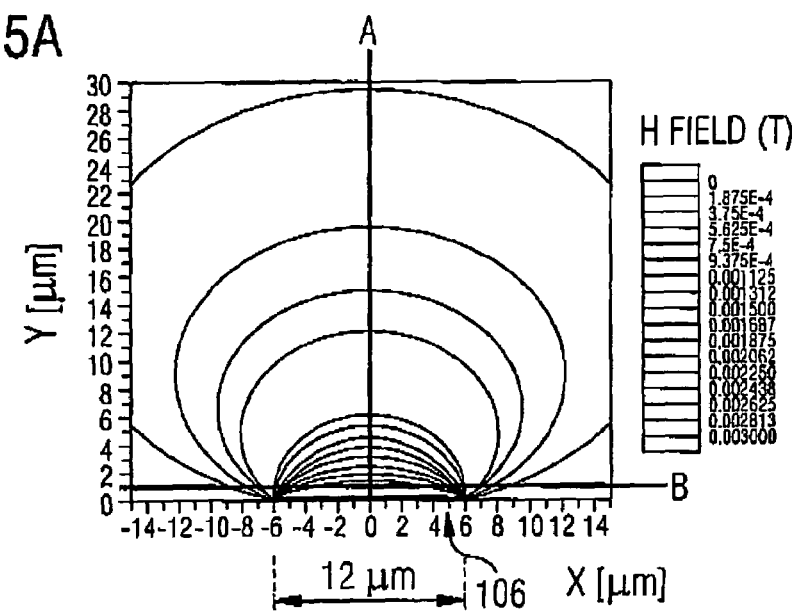
FIGS. 5a-c show an exemplary, qualitative illustration of the occurring magnetic field distribution or a resulting temperature course during an on-wafer function test of the inventive magnetoresistive magnetic field sensor element.

Subsequently, with reference to the accompanying FIGS. 1 to 8, preferred embodiments of inventive magnetoresistive magnetic field sensor elements, as well as the concept for manufacturing and testing the same according to the present invention will now be set forth in detail. With reference to the subsequent description of the preferred embodiments of the present invention, it is to be noted that the same reference numerals will be used for functionally identical or similarly acting or like elements throughout the description for simplification.

In the following, with reference to FIGS. 1a-b, the construction of a magnetoresistive magnetic field sensor element according to a first embodiment of the present invention is now explained in detail by way of example, wherein a simple, principle electric equivalent circuit diagram thereof is also indicated.

With reference to the subsequent discussion of the present invention, it should be noted in general that the inventive concept may be applied to substantially all magnetoresistive devices, sensor elements, or sensor arrangements, wherein the application is exemplary described there with a magnetoresistive sensor element or a magnetoresistive sensor arrangement for simplification of the subsequent description. It should, however, become obvious that regarding construction, build-in, set-up, electrical criteria, etc. the inventive concept subsequently set forth may also be applied to other magnetoresistive sensor elements, such as AMR (anisotropic magnetoresistance) sensor elements, GMR (giant magnetoresistance) sensor elements, TMR (tunnel magnetoresistance) sensor elements, and CMR (colossal magnetoresistance) sensor elements, wherein these magnetoresistive sensor elements mentioned may be summarized under the term "xMR sensor elements". Since all magnetoresistive elements may be employed according to the present invention, the above enumeration is not to be regarded as concluding.

In FIG. 1a, a magnetoresistive single sensor element 100, which comprises a substrate 102, is illustrated. The substrate 102 may include any material, such as semiconductor material, and particularly silicon, and any structure, in particular. The substrate 102 may be formed in integrated manner or comprise a stack of several material layers. A first insulation layer 104, e.g. an oxide layer, on which a current conductor structure 106 with a width $C_1$ is arranged, is formed on the substrate 102. The current conductor structure 106 is at least partially surrounded by a further insulation layer 108, such as a passivation layer in form of a nitride layer, wherein a permanently magnetizable magnetic field sensor structure 110 with a width of $C_2$ is arranged on this second insulation layer 108, so that the permanently magnetizable magnetic field sensor structure 110 and the associated current conductor structure 106 are spatially separated from each other by a distance $C_3$ and electrically insulated from each other. Optionally, the permanently magnetizable magnetic field sensor structure 110 is covered with a further insulation or passivation layer 111.

According to the present invention, the current conductor structure 106 is formed so that a magnetization signal can be launched into the current conductor structure 106 via first and second current conductor contacts (contact pads) 106-1, 106-2 (shown in FIG. 1b), for example, in order to obtain a substantially defined magnetization magnetic field component in the magnetic field sensor structure 110, so as to effect permanent, local magnetization of the magnetic field sensor structure 110 when the permanently magnetizable magnetic field sensor structure 110 of the inventive magnetic field sensor element 100 of FIG. 1 does not yet have permanent magnetization.

When the permanently magnetizable magnetic field sensor structure 110 of the inventive magnetic field sensor element 100 of FIG. 1a already has permanent magnetization, a test signal can further be applied between the current conductor contacts 110-1, 110-2 via the magnetic field sensor structure 110, for example via two sensor element contacts 110-1, 110-2 (shown in FIG. 1b), in order to obtain a defined test magnetic field component in the magnetic field sensor structure, so that a magnetic-field-dependent, electrical characteristic can be sensed. This magnetic-field-dependent, electrical characteristic preferably is a change in the magnetic-field-dependent resistivity of the magnetic field sensor structure 110 due to the magnetoresistive effect.

Optionally, the current conductor structure 106 may further be formed so that it heats due to a launched electric heating signal, such that also a temperature in the permanently magnetizable magnetic field sensor structure 110 is increased from a first temperature value below a so-called blocking temperature to a second temperature value above the magnetization minimum temperature (blocking temperature), to enable "inscribing" the permanent magnetization in the magnetic field sensor structure 110.

Subsequently, it will now be gone into how the magnetization inscription process for obtaining a permanent magnetization of the magnetic field structure 110 can be performed by the structure of the inventive magnetoresistive magnetic field sensor element 100 illustrated in FIGS. 1a-b in detail, wherein, in this connection, reference is also made to German patent application DE102004032483.2-24 of the same applicant as the present invention.

With reference to the subsequent figures, it will then be gone into how the inventive magnetoresistive magnetic field sensor element is to be designed specifically to be able to perform the inventive method of performing an on-wafer function test of a plurality of magnetic field sensor elements arranged on a wafer.

In order to be able to provide the magnetic field sensor structure 110 of the inventive magnetic field element 100 with permanent magnetization, it is required, on the one hand, to heat the permanently magnetizable magnetic field sensor structure 110 to a temperature value above its blocking temperature (magnetization minimum temperature), and furthermore to effect a defined minimum magnetization magnetic field component in the magnetic field sensor structure 110, which is sufficiently strong to achieve orientation of the reference magnetization in the desired direction in the magnetic field sensor structure 110. With reference to the adjustable temperature value for the magnetization procedure, a temperature value ranging from 20 to 100° C. above the blocking temperature is preferably used here, wherein a typical blocking temperature of xMR materials lies in a range of 350 to 400° C. and typically at about 380° C. For generating the permanent magnetization, exceeding the minimum magnetization magnetic field component on the one hand and the magnetization minimum temperature on the other hand is thus required.

By a permanently magnetizable magnetic field sensor structure, a structure or layer enabling to freely adjust magnetization of the structure above a blocking temperature depending on an impacting, external magnetization magnetic field as far as a certain threshold value of the magnetization magnetic field serving for orientation is exceeded is understood in the context of the present invention. In connection with the present invention, as blocking temperature, a minimum temperature value predetermined by the material of the permanently magnetizable magnetic field sensor structure is understood, in which the magnetization is freely adjustable when exceeding it, whereas the present magnetization is "frozen" to the magnetization predetermined by the external magnetization magnetic field when it is under run.

Since the magnetic field of a current-carrying, straight current conductor is inversely proportional to the distance, by suitable design of the distance between the magnetic field sensor structure 110 and the current conductor structure 106 in the magnetic field sensor element 100 of FIG. 1, it can be achieved that the magnetization magnetic field emanating from the current conductor structure 106 is (preferably only slightly) higher than the threshold value required for achieving permanent magnetization in the desired direction, wherein a magnetization magnetic field exceeding the minimum magnetization magnetic field by a value of about 5 to 10 mT is preferably employed.

Typically, the magnetization magnetic field should be greater than about 30 mT at the desired location of the magnetic field sensor structure 110, in order to guarantee orientation of the magnetization of the magnetic field sensor structure 110, wherein a typically required magnetization magnetic field ranges from about 40 to 55 mT perpendicular to the magnetic field sensor structure 110.

Heating the permanently magnetizable magnetic field sensor structure 110 is for example achieved by means of heating by laser light to a temperature above the blocking temperature, wherein it is optionally also possible, with reference to the present inventive magnetic field sensor element 100, to achieve the blocking temperature in the magnetic field sensor structure 110 by the current conductor structure 106 also being effective to also achieve corresponding heating of the associated magnetic field sensor structure 110 above the blocking temperature, starting from sufficient current strength therein and heating of the current conductor structure 106 resulting there from.

With reference to FIG. 2, a possible technical realization of the inventive magnetic field sensor element 100 illustrated in FIG. 1 in vertical integration of the magnetic field sensor element 100 by means of a metal layer stack with the metal layers M1, M2, M3, and M4 and insulation layers lying there between is illustrated at the example of a C9NE structure. As it is shown in FIG. 2, the metal layer stack M1-M4 is disposed above the active chip area 102 in the oxide material 104, wherein the permanently magnetizable magnetic field sensor structure 110 is arranged within the passivation layer 108, e.g. a plasma nitride layer. Furthermore, in FIG. 2, vias 112 for connecting the magnetic field sensor structure 110 to a metal layer of the metal layer stack M1-M4 are illustrated.

With reference to the arrangement illustrated in FIG. 2, it should be noted that the metal layer stack M1-M4 with the xMR layer 110 is substantially technology-independent. The metal layer stack M1-M4 with the xMR layer 110 may thus be integrated on the chip passivation above the active chip area 102 in a vertical integration, or without active circuit 102 and without routing in a horizontal integration.

The arrangement illustrated in FIG. 2 illustrates the integration of the metal layer stack M1-M4 with the xMR layer 110 for a vertical integration. The wiring of the xMR magnetic field sensor structure 110 may take place above the xMR magnetic field sensor structure 110 by introducing an additional metal plane M5 (not shown in FIG. 2) or be made on the metal plane M4 already present by the interconnects or vias 112. Below the xMR layer stack, on the metal layer M4, for example, a metallic protection plate is planned, which protects the underlying logic circuits in the active chip area 102 in a layer inscription process from laser light on the one hand and balances the temperature gradients on the other hand, which may exert strong influence on the accuracy of the xMR magnetic field sensor structure 100 by causing an offset signal.

The current conductor structure 106, i.e. the test wiring or the test wire, for the generation of the test magnetic field may either lie on the metal layer M4 or on an additional metal layer M5 not shown in FIG. 2. In the case of pre-magnetizing or inscribing the permanent, local magnetization into the magnetic field sensor structure 110 by means of laser light, the metal plane or metal layer M5 often cannot be arranged in the metal layer stack indicated in FIG. 2, since the current conductor structure 106 could otherwise prevent directly heating the magnetic field sensor structure 110 by means of laser beams. Furthermore, the current conductor structure 106, when also used for the generation of the inscribing magnetic field, may be arranged on the optional metal layer M5.

With reference to the arrangement with the metal layer stack M1-M4 illustrated in FIG. 2, in principle, it is thus preferred to arrange (to route) the current conductor structure 106 on the metal layer plane M4. For this, however, it is required to interrupt the metal layer M4 previously described (as serving as metal protection plate), so that the current conductor structure 106 may there be routed on the metal layer M4. Furthermore, it is to be noted that the current conductor structure 106 and the metal plate (metal layer M4) must not abut each other and are preferably separated from each other by an insulation layer, this insulation layer being generally translucent. So as to not put the underlying active circuits in the semiconductor material 102 at risk by incident laser light, metal plates arranged directly below the clearances or gaps in the metal layer plane M4 (in the layout) should still be inserted on the metal layer M3.

With reference to the arrangement illustrated in FIG. 2, it should further be noted that the current conductor structure 106 is preferably formed wider than the xMR magnetic field sensor structures on the metal layer M4, to achieve a substantially homogeneous test magnetic field or inscribing magnetic field over the entire width of the xMR magnetic field sensor structure 110 (xMR resistance structures), as this will still be explained in detail with reference to the subsequent figures, and particularly with reference to FIGS. 5a-c, 6a-c.

In the following, with reference to FIGS. 3a-c, now exemplary, specific embodiments and realizations of inventive magnetic field sensor elements 100 will be explained, particularly also going into the resulting magnetic field components generated in the current conductor structure 106, such as the magnetization signal or the test signal, to obtain a defined magnetization magnetic field component or a test magnetic field component in the magnetic field structure 110 or in two magnetic field structures 110a, 110b connected to each other, as this is illustrated in FIGS. 3a-c. Here, it is gone into the different, resulting magnetic field courses, depending on the specific arrangement of the current conductor structure 106 (test wire routing), in particular.

With reference to the current direction of the launched current signal $I_{Signal}$, it is to be noted that in FIGS. 3a-c the symbol "⊗" is supposed to indicate a current direction into the drawing plane and the symbol "" a current direction out of the drawing plane.

As illustrated in FIG. 3a, the magnetic field sensor element 100 illustrated there comprises two magnetoresistive magnetic field sensor structures or sensor elements 110a, 110b, which are electrically connected to each other by means of a contact bridge 114, e.g. an aluminum bridge, on the one hand, and may further be electrically contacted externally via conducting metal contacts 116, e.g. aluminum contacts. Furthermore, a connection 110c designated with "meander" is indicated between the active, magnetoresistive sensor elements 110a, 110b, which is embodied in semicircular manner, for example, (cf. also FIGS. 3b-c).

Below the magnetoresistive magnetic field sensor structures 110a, 110b (with reference to the illustration in FIG. 3a), the current conductor structure 106 is illustrated, which comprises a first current conductor structure portion 106a arranged below the first magnetoresistive sensor element 110a, which comprises a second current conductor structure portion 106b arranged below the second magnetoresistive sensor element 110b, and which comprises a third current conductor structure portion 106c arranged in the plane of the current conductor structure between the first and second current conductor structure portions 106a, 106b and providing a current feedback for the magnetization signal or the test signal from the first current conductor structure portion 106a to the second current conductor structure portion 106b, so that the current conductor structure 110 illustrated in FIG. 3a has a meander shape, for example.

The current conductor structure portion 106c is required for feedback of the signal $I_{Signal}$ (magnetization signal or test signal) launched into the current conductor structure 106 from the first current conductor structure portion 106a to the second current conductor structure portion 106b, so that, by the first and second current conductor structure portions 106a, 106b, magnetic fields $B_1$, $B_2$ (test magnetic fields or magnetization magnetic fields) are generated in the same direction and preferably with the same strength in the first and second magnetoresistive magnetic field sensor structures 110a, 110b. By the third current conductor structure portion 106c, however, a magnetic field $B_3$ is generated in the direction opposite thereto.

If the current conductor structure 106 is imparted with the signal $I_{Signal}$, such as the magnetization signal or the test signal, in the current direction illustrated in FIG. 3a, the magnetic field courses (inscribing magnetic field courses or test magnetic field courses) $B_1$, $B_2$, $B_3$ illustrated there also result.

For example, the current conductor structure 106 illustrated in FIG. 3a is arranged of aluminum on the metal layer stack layer M4 (cf. FIG. 2) with a feedback, i.e. the current conductor structure portion 106c, wherein the arrangement of the inventive magnetic field sensor element 100 illustrated in FIG. 3a is the most simple one of the arrangements for magnetic field sensor elements 100 illustrated in FIGS. 3a-c as to its construction. The arrangement shown in FIG. 3a requires no additional vias for guiding or launching the test or magnetization signal into the current conductor structure 106 or the measurement signal into the sensor element 110. Furthermore, with reference to the arrangement illustrated in FIG. 3a, it is to be noted that the resulting area need thereof is to be regarded as average, since the current conductor structure portion 106c illustrated in FIG. 3a is required for the current feedback of the signal $I_{Signal}$ (magnetization signal or test signal) guided through the current conductor structure 106 and thus area is required for this signal feedback.

Moreover, it should be noted that this signal feedback by means of the current conductor structure portion. 106c generates a magnetic field $B_3$ opposite to the magnetic field components B1, B2 (magnetization magnetic field component or test magnetic field component) penetrating the magnetoresistive magnetic field structures and thus capable of distorting the magnetic field components $B_1$, $B_2$. The resulting distortions of the magnetic field components $B_1$, $B_2$ by the magnetic field $B_3$ generated by the signal flowing in the feedback portion 106c of the current conductor structure are dependent, above all, from the width ratio of the current conductor structure, i.e. of the current conductor structure portions 106a, 106b associated with the magnetoresistive magnetic field sensor structures 110a, 110b to the associated magnetoresistive magnetic field sensor structure 110a, 110b, and also from the distance between the current conductor structure portions 106a, 106b to the current conductor structure portion 106c, which is effective as feedback.

In the following, it is now gone into the arrangement of the inventive magnetic field sensor element 100 illustrated in FIG. 3b.

As can be seen from FIG. 3b, the construction of the magnetoresistive arrangement illustrated in FIG. 3b differs from the arrangement illustrated in FIG. 3a in that the current conductor structure portion 106c effective as current feedback is arranged (routed) outside the meander structure of the magnetoresistive magnetic field sensor structures 110a, 110b, wherein an additional via 118 is required for contacting the current conductor structure 106, i.e. the current conductor structure portion 106d. The current conductor structure 106 illustrated in FIG. 3b is again arranged on the metal layer plane M4 (cf. FIG. 2) and in "concentric circles", for example. Thereby, the magnetic field $B_3$ caused by the feedback substantially cannot distort the magnetic field (magnetization magnetic field or test magnetic field) through the magnetoresistive magnetic field sensor structures 110a, 110b.

The currents $I_{Signal}$ flowing in the current conductor structure 106 for the magnetization signal or the test signal are to be chosen, in the arrangement illustrated in FIG. 3b, substantially just as great as in the arrangement illustrated in FIG. 3a. The area overhead or area need of the magnetic field sensor arrangement illustrated in FIG. 3b is, however, slightly higher than in the variant of the magnetic field sensor element arrangement 100 illustrated in FIG. 3a. Since high current densities of 100 mA and more may occur for guiding, above all, the magnetization signal in the current conductor structure 106, it may for example be required to form the via 118 by a plurality of vias (not shown in FIG. 3b) connected in parallel, whereby additional area need arises. Furthermore, it should be noted that vias may lead to an offset signal in the sensor output signal, i.e. the output signal of the magnetoresistive magnetic field sensor structures 110a, 110b.

In the following, it is now gone into the magnetic field sensor element arrangement 100 illustrated in FIG. 3c.

As can be seen from FIG. 3c, the magnetic field sensor element arrangement 100 illustrated in FIG. 3c comprises four current conductor structure portions 106a, 106b, 106d and 106e, wherein the current conductor structure portion 106a and the current conductor structure portion 106d are associated with the first magnetoresistive magnetic field sensor structure 100a, and the current conductor structure portions 106b and 106e are associated with the second magnetoresistive magnetic field sensor structure 110b, and the four current conductor structure portions 106a, 106b, 106d, 106e generate the magnetic field components $B_1$, $B_2$, $B_4$, and $B_5$, when a current signal $I_{Signal}$ flows through the same. It becomes obvious that the current conductor structure portion 106c required in FIGS. 3a and 3b is not required in the arrangement illustrated in FIG. 3c.

As it is further illustrated in FIG. 3c, further vias 120, 122, and 124 are also provided, wherein the via 120 is provided to electrically connect the current conductor structure portions 106a and 106d with each other, and the via 122 is provided to electrically connect the current conductor structure portions 106b and 106e with each other. The via 124 is provided to be able to connect the current conductor structure 106 to the outside.

Furthermore, with reference to the magnetic field sensor element arrangement illustrated in FIG. 3c, it should be noted that the current conductor structure portions 106a and 106b may for example again be arranged on the metal layer stack plane M4 (cf. FIG. 2), wherein the current conductor structure portions 106d and 106e may then for example be arranged on the additional metal layer stack plane M5.

In the following description, the current signal through the current conductor structure portions 106a and 106b is referred to as forward current, and the current signal through the current conductor structure portions 106d and 106e as backward current.

With reference to the magnetic field sensor element arrangement illustrated in FIG. 3c, it becomes obvious that both currents, i.e. the forward current $I_{Signal1}$ and the backward current $I_{Signal2}$, contribute to the magnetic field build-up in the associated magnetoresistive magnetic field sensor structures 110a, 110b. Thereby, the current strength through the current conductor structure portions 106a, 106b, 106d, and 106e may be halved as opposed to the arrangements illustrated in FIGS. 3a-b, since the magnetic field components $B_1$, $B_4$ and $B_2$, $B_5$ generated by the current conductor structure portions 106a and 106d and by the current conductor structure portions 106b and 106e, respectively, overlay and preferably add each other.

In the embodiment illustrated in FIG. 3c for a magnetic field sensor element arrangement, thus a decreased area need results as opposed to the previously illustrated arrangement. The magnetic field sensor element arrangement illustrated in FIG. 3c, however, requires frequent change between the metal planes M4 and M5 by means of the vias 120, 122, and 124, wherein it may be required (as already indicated above), due to the required high current strength for the magnetization signal or test signal, that the vias are replaced by vias connected in parallel. Here, it is to be noted, however, that an undesired offset portion may occur in the resulting output signal due to possibly occurring, different transition resistances of the vias. Furthermore, with reference to the magnetic field sensor element arrangement illustrated in FIG. 3c, is should be noted that for this embodiment heating the magnetoresistive magnetic field sensor structures 110a and 110b by means of laser irradiation for the inscription process often cannot be employed.

In the following, the arrangement of a magnetic field sensor element in form of a double bridge circuit and the execution of a functional test on this double bridge arrangement is now explained on the basis of FIG. 4.

As illustrated in FIG. 4, such a double bridge arrangement includes eight individual magnetic field sensor elements 202a-h, wherein the four magnetic field sensor elements 202a-d form a first bridge arrangement 204 and the magnetic field sensor elements 202e-h a second bridge arrangement 206. The four magnetic field sensor elements 202a-d of the first bridge arrangement 204 generally have a straight, elongated shape each and extend in the X direction indicated in FIG. 4. The magnetic field sensor elements 202e-h of the second bridge arrangement 206 also have a straight, elongated shape each, but extend in the Y direction indicated in FIG. 4, i.e. perpendicular to the four magnetic field sensor elements 202a-d of the first bridge arrangement 204.

The magnetic field sensor elements 202a-d of the first bridge arrangement 204 and the magnetic field sensor elements 202e-h of the second bridge arrangement 206 each comprise a permanently magnetizable magnetic field sensor structure, in which a magnetization perpendicular to the longitudinal direction of the magnetic field sensor structures formed as strips is to be generated each, and the magnetic field sensor elements 202a-d of the first bridge arrangement 204 and the magnetic field sensor elements 202e-h of the second bridge arrangement 206 each comprise and already permanently magnetized magnetic field sensor structure, which comprises magnetization perpendicular to the longitudinal direction of the magnetic field sensor structure formed as strips each.

In the first and second bridge circuit arrangements, the magnetizations of opposing magnetic field sensor structures each, i.e. the magnetic field sensor structure 202a to 202c and 202b to 202d, and 202e to 202g and 202f to 202h, respectively, are each oriented in antiparallel manner. In FIG. 4, contacts A1, A2, B1 and B2 for launching the signal current $I_{Signal}$ into each branch of the double bridge arrangement 200 are also provided.

On the basis of field simulations, as they are explained in detail subsequently with reference to FIGS. 5a-c and 6a-c, it may be shown that a magnetic field distortion due to the overlay of various magnetic fields generated by the current conductor structure 106, i.e. the test magnetic fields or the magnetization magnetic fields, no longer has a disadvantageous effect on the sensor output signal $V_X$, $V_Y$ in the area of the magnetoresistive magnetic field sensor structures 202a-h (of the xMR resistors).

If the magnetoresistive magnetic field sensor structures 202a-h are connected in the double bridge circuit illustrated in FIG. 4, it is required that the test magnetic fields (or the magnetization magnetic fields) of all magnetoresistive magnetic field sensor structures of the same bridge arrangement 204 or 206 are unidirectional. In FIG. 4, for example, a possible arrangement (routing) of the current conductor structure 106 below the individual magnetoresistive magnetic field sensor structures 202a-h and a corresponding connection are indicated, wherein the terminal A1 is used as an input terminal and the terminal B2 as output terminal of the magnetic field sensor element arrangement 200 for launching and outputting, respectively, the test or magnetization signal $I_{Signal}$, whereas the terminals B1 and A2 are electrically connected to each other.

The arrangement for testing (or magnetizing) the individual magnetoresistive magnetic field sensor structures 202a-h illustrated in FIG. 4 may either be arranged as a fixed layout, or the occupancy of the contacts A1, A2, B1, and B2 may be made by a tester (e.g. a needle tester) or in laboratory set-up. The test or magnetization current is launched into the magnetic field sensor element arrangement 200 of FIG. 4 via the contacts A1 and B2. In order to generate a constant test magnetic field, which is for example constant with reference to the temperature course, the signal current $I_{Signal}$ is preferably generated by a constant current source. The signal current thus generates a test magnetic field or magnetization magnetic field orthogonal to the signal current direction.

In the following, it is now gone into the test conditions in detail.

For testing the magnetic field sensor element arrangement 200 of FIG. 4, directly measurable output signals $V_X$ and $V_Y$ are required at the center taps of the first and second bridge circuits 204, 206 of the double bridge circuit arrangement 200 of FIG. 4. To this end, magnetic fields in an order of several mT (millitesla) are required in order to magnetically saturate the so-called free layer (plateau of the xMR transition function of the minor loop). Free layer is that layer that is allowed to or can be rotated by the magnetic field. Plateau is the magnetic saturation of the sensor module, which lies within the working range.

Since the current conductor structure 106 is for example arranged at a distance of about one micrometer (1 μm) away from the magnetoresistive magnetic field sensor structures 202a-h, signal currents $I_{Signal}$ on an order of several milliamperes (mA) are required for the generating of magnetic fields with an order of several millitesla in the magnetoresistive magnetic field sensor structures.

With reference to the magnetic field sensor element arrangement 200 illustrated in FIG. 4, it should further be noted that the impressed magnetic field should substantially be constant, so that the signal current is preferably impressed from a constant current source (not shown in FIG. 4). Furthermore, it is required that the current conductor structure 106 is designed for the resulting, relatively high current densities of the signal current $I_{Signal}$, wherein the dimensioning rules indicated with reference to FIGS. 1a-b, for example, are to be met for this.

Furthermore, it should be noted that the current conductor structure 106 can still be used for online self-tests of the magnetic field sensor element arrangement 200 during the operation thereof or in the built-in state thereof after the function test after or during the manufacture of the magnetic field sensor elements or the magnetic field sensor element arrangement.

In FIG. 5a, the magnetic excitation is now indicated perpendicular to the current flow direction of the current signal $I_{Signal}$ exemplary for a current conductor structure 106. The magnetic field distribution (magnetic excitation) indicated in FIG. 5a is obtained, for example, if a current conductor, i.e. the current conductor structure 106, which is for example arranged on the metal stack layer M4, has a thickness of 600 nm and a width of 12 μm, with the current strength in the current conductor structure being 60 mA.

The resulting magnetic field (test magnetic field or magnetization magnetic field) has to be as homogeneous as possible with reference to the field distribution and as constant as possible with reference to temperature changes or changes of other environment variables.

Figure 5B:
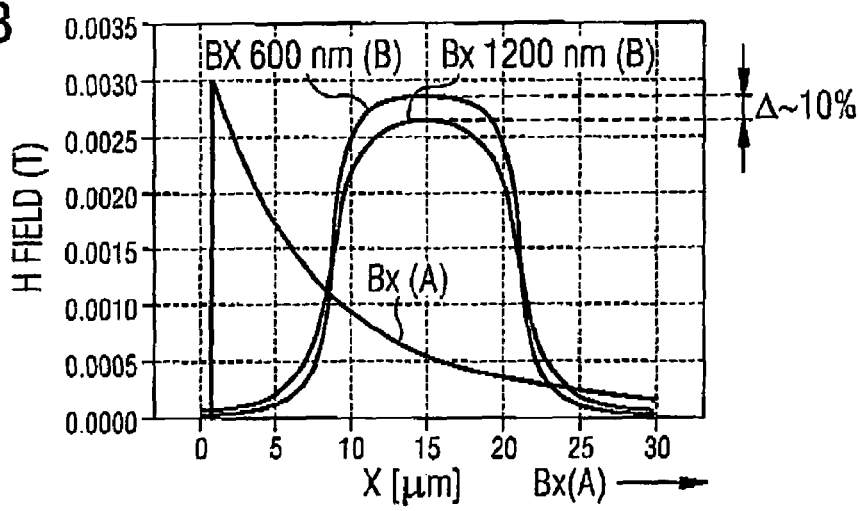

In FIG. 5a, the abscissa B designates the extension perpendicular to the center of the current conductor and thus perpendicular to the current direction in the current conductor structure 106, wherein the ordinate A represents the resulting magnetic field strength depending on the distance perpendicular to the surface of the current conductor structure 106. The sectional views from FIG. 5a and illustrated in FIG. 5b show the magnetic field distribution parallel to the axis B at two various distances (600 nm and 1200 nm) from the metal stack layer M4, on which the current conductor structure 106 is arranged. From FIGS. 5a and 5b, it becomes obvious that, at a distance of about 1.2 μm above the current conductor structure 106, there is a relatively homogeneous magnetic field with a magnetic field strength of 2 mT across a width of about 12 μm, which is sufficiently high as "characterization field" for the examination of the function parameters of the inventive magnetic field sensor element arrangement 200 after the manufacture thereof. Moreover, the field distribution curve in FIG. 5b shows a decrease of the field parallel to the axis A by only about 10% at a doubling of the distance (600 nm to 1200 nm), so that there is not a very high distance sensitivity of the magnetic field generated by the current conductor structure 106.

Figure 5C:
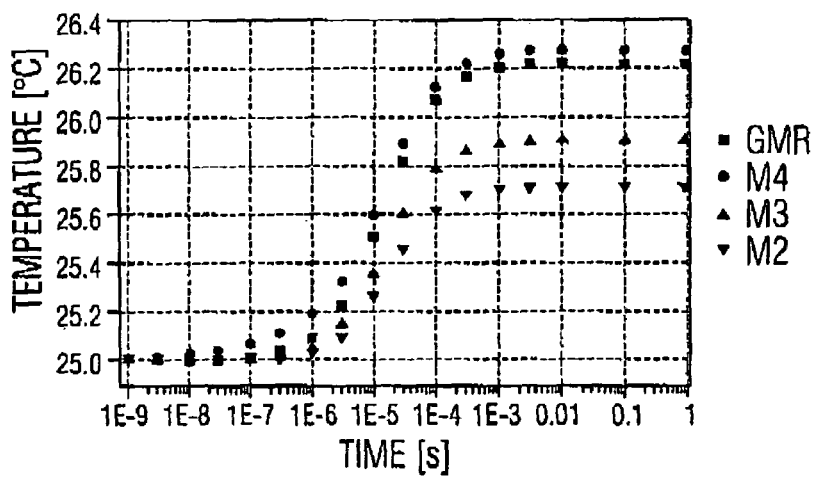

In FIG. 5c, the heat development of the layers of the metal layer stack (cf. FIG. 2) arranged around the magnetoresistive magnetic field sensor structures is indicated over the time duration with reference to a current strength of 60 mA in the 12 μm wide and 600 nm thick current conductor structure 106 adjacent to the magnetoresistive magnetic field sensor structures. From FIG. 5c, it can be seen that the temperature of the magnetoresistive magnetic field sensor structures increases by only about 1° C. within a time duration of 1 second in the previously illustrated measurement or characterization with a current strength of 60 mA.

In the following, with reference to FIGS. 6a-c, it is gone into the physical conditions with reference to magnetic field distribution and temperature change in the area around the current conductor structure 106 of the inventive magnetic field sensor element 100 during an xMR online self-test of the magnetic field sensor element 100.

For the online self-test, a relatively low test magnetic field, which may indeed be superimposed by noise portions, is required so as not to distort the external magnetic field, wherein thereby only a relatively low test current $I_{Signal}$ and thus a relatively low current consumption is required, and also only a relatively small temperature increase is caused at the magnetoresistive magnetic field sensor structures and the structures arranged adjacent to the current conductor structure 106, such as the active structures in the semiconductor substrate 102. FIG. 6a shows the magnetic excitation, i.e. the distribution of the magnetic field, perpendicular to the current flow direction in the current conductor structure 106, wherein the current conductor structure 106 is for example arranged on the metal layer plane M4 (cf. FIG. 2) and has a thickness of 600 nm and a width of 12 μm and is provided with a test signal (current signal) $I_{Signal}$ with a current strength of 1 mA.

Figure 6A:
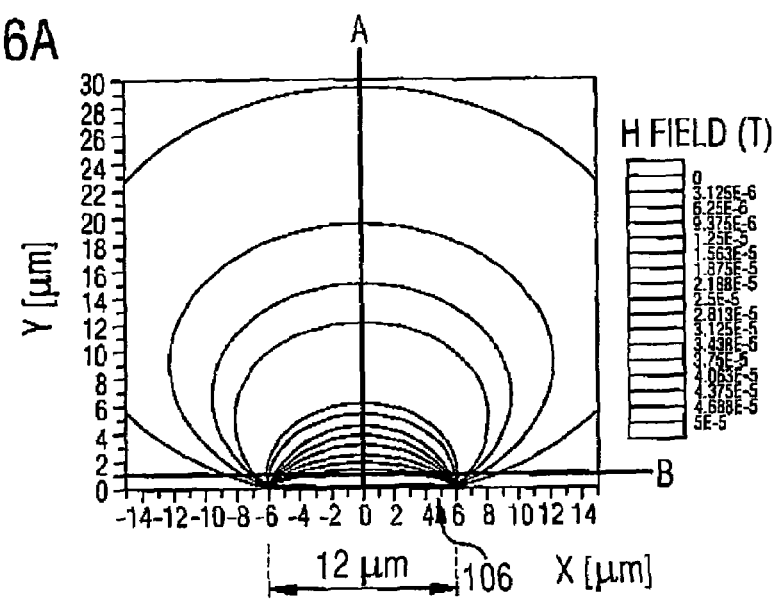
FIGS. 6a-c show an exemplary, qualitative illustration of the occurring magnetic field distribution or a resulting temperature course during an online function test of the inventive magnetoresistive magnetic field sensor element.
Figure 6B:
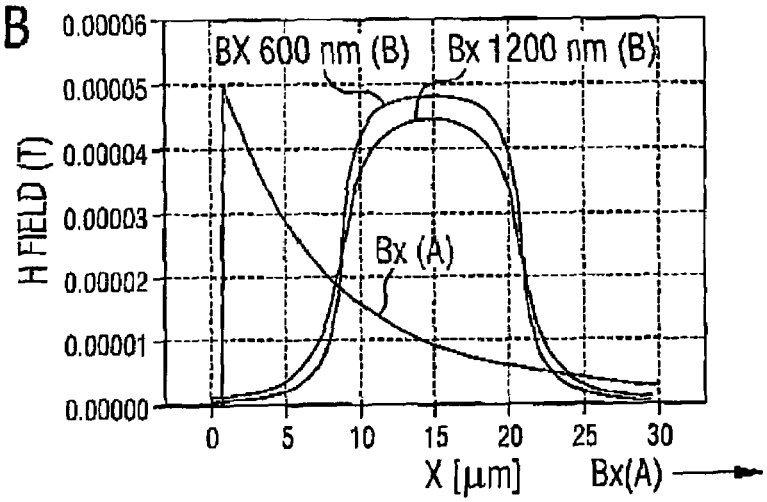

The sectional views from FIG. 6a and illustrated in FIG. 6b show the magnetic field distribution parallel to the axis B at two various distances (600 nm and 1200 nm) from the metal layer plane M4, on which the current conductor structure 106 is arranged. From FIGS. 6a and 6b, it becomes obvious that, at a distance of 1.2 μm above the metal layer plane M4, there is a relatively homogeneous magnetic field with a magnetic field strength of about 30 μT across a width of about 12 μm, which is sufficiently high as test magnetic field during an online test of the inventive magnetic field sensor element arrangement 200. Moreover, the magnetic field distribution curve in FIG. 6b shows a decrease of the magnetic field by only about 10% parallel to the axis A at a doubling of the distance perpendicular to the plane of the current conductor structure 106, so that it becomes obvious that there is no high distance sensitivity of the magnetic field with the inventive arrangement of the magnetic field sensor element 100.

Figure 6C:
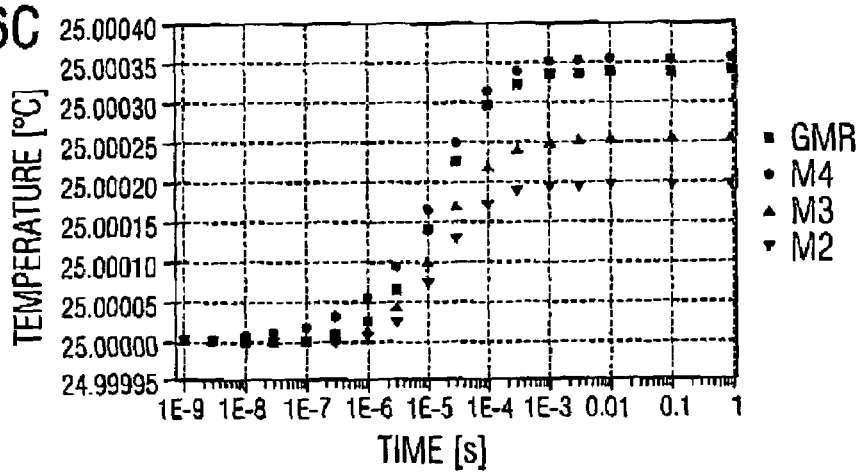

FIG. 6c shows the heat development of the layers (cf. FIG. 2) arranged adjacent to the magnetoresistive magnetic field sensor structures and the current conductor structure 106 over the time duration at a test current with a current strength of 1 mA. From FIG. 6c, it becomes obvious that the resulting temperature increase of the magnetoresistive magnetic field sensor structures and the adjacent layers are substantially negligible within a period of 1 second.

From the above statements with reference to the inventive magnetoresistive sensor element 100, it thus becomes obvious that it is particularly advantageous to embody the width $C_2$ of the magnetizable magnetic field sensor structure 110 smaller than or equal to the width $C_1$ of the associated current conductor structure 106. Furthermore, it is advantageous to arrange the magnetic field sensor structure 110 at a distance $C_3$ from the associated current conductor structure 106, which is smaller than about 20% and preferably smaller than 10% of the width $C_1$ of the current conductor structure 106. With reference to the above statements, it is assumed that the current conductor structure 106 and the magnetizable magnetic field sensor structure 110 are arranged substantially in parallel and overlapping each other with reference to the main current flow direction through the same. Taking these preferred preliminaries into account, it may be achieved that the test or magnetization magnetic field generated by the current conductor structure 106 is substantially homogeneous within the magnetizable magnetic field sensor structure 110 and is not disturbed by other magnetic fields.

In the following, with reference to FIG. 7, a possible, principle arrangement and procedure for performing an online self-test is exemplary explained with reference to the magnetic field sensor element arrangement 200 illustrated in FIG. 4. Regarding the self-test of magnetic field sensor element arrangements, reference is also made to German patent application DE10337045.5-52, which is associated with the same applicant as the present invention.

Figure 7:
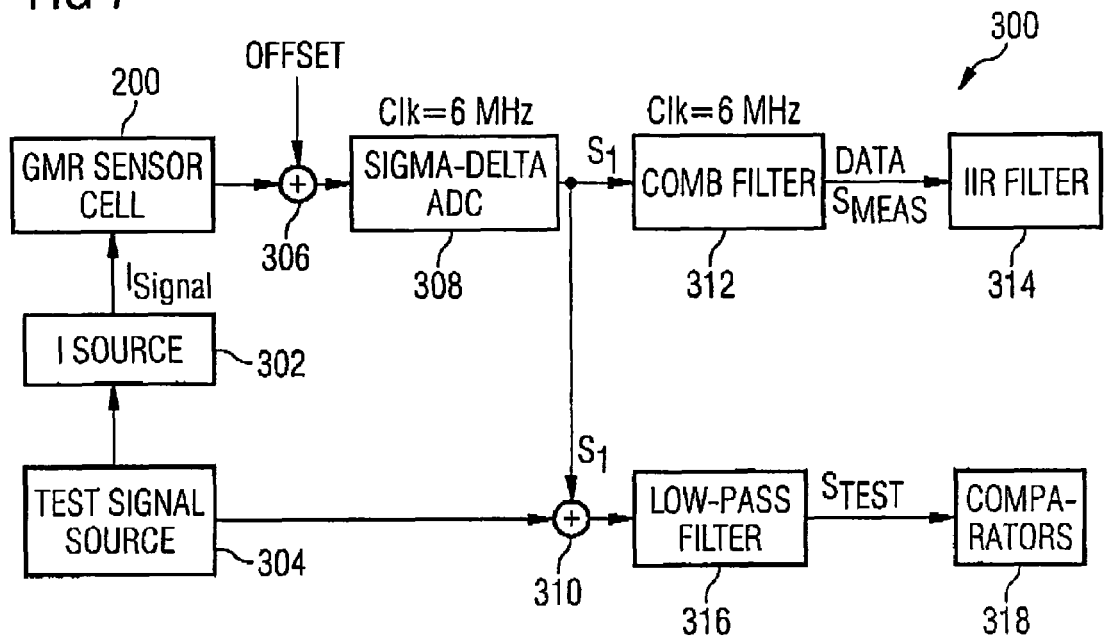
FIG. 7 shows a principle illustration of the functional blocks for performing a self-test of the functionality of the inventive magnetic field sensor element.

As it is illustrated in FIG. 7 with reference to an exemplary, possible embodiment of a self-test arrangement 300 for magnetic field sensor element arrangements 200, the self-test arrangement 300 comprises a magnetic field sensor element arrangement 200 (xMR sensor cell), a current source 302, a test signal source 304, a first combination means 306, a sigma-delta analog/digital converter 308, a second combination means 310, a comb filter 312, an IIR filter 314, a low pass filter 316, and comparators (comparison means) 318. The circuit blocks schematically illustrated in FIG. 7 are functionally linked to each other, as it is exemplary shown in FIG. 7.

In the following, the functioning of the self-test arrangement 300 illustrated in FIG. 7 will be explained.

The test signal source 304 generates a higher-frequency test signal with reference to the actual useful signal, the frequency range of which lies over the useful signal bandwidth. In the most general case, this test signal may be generated by any signal source. For example, a derivation of this signal from the system clock signal or the generation by a pseudo-random generator makes sense for implementation. If the system clock signal is used for signal generation, it should be divided by a prime number, to minimize system clock signal influences (correlations) in the ensuing evaluation of the test signal.

The test signal should be lower-frequent than the system clock signal, to eliminate aliasing effects. The test signal $I_{Signal}$ is impressed into the current conductor structure 106 of the M4 metal layer stack plane via the constant current source 302, which is embodied as a current mirror circuit, for example, when this M4 metal stack plane forms the current conductor structure 106.

Thereby, the magnetic test field is generated, wherein this test magnetic field effects a small magnetic field change causing a higher-frequent, "unnoticeable" amplitude change of the sensor output signal of the magnetic field sensor element arrangement 200 in each partial bridge arrangement of the magnetic field sensor element arrangement 200. This amplitude change may indeed be superimposed by white noise, as this is for example is to be suggested by the first combination means 306 and the launched offset signal in FIG. 7. After the analog/digital conversion in the sigma-delta analog/digital converter 308, the known higher-frequency signal now present is demodulated with the second combination means 310, which is effective as a demodulator, low-pass filtered (integrated) with the low pass filter 316, signal-processed and compared with a predetermined threshold value by means of the comparators 318. If the predetermined threshold value is not reached, this indicates a malfunction of the inventive magnetic field sensor arrangement 200 (of the xMR sensor cell), the sampling unit 306, or the analog/digital converter 308.

The higher-frequency signal portion $S_1$ is filtered out by the comb filter 312 in the signal path, wherein the test signal $S_{TEST}$ is no longer present in the useful signal $S_{MEAS}$ after this filtering. Alternatively, there is also the possibility to communicate the integrated test signal to a post-processing microcontroller directly, wherein this microcontroller may then further evaluate the present signal.

The self-test arrangement illustrated in FIG. 7 should, however, only be regarded as one of a number of possible applications for a self-test to be performed on the magnetic field sensor element arrangement 200, on the sigma-delta analog/digital converter, and on the ensuing filtering in the signal path.

In the following, with reference to FIG. 8, a possible procedure for estimating the obtained test signal will now be presented. The signal response to the test signal depends, among other things, on the angular position of the external magnetic field present at the magnetic field sensor element arrangement, as this becomes obvious from FIG. 8, for example. Hence, the signal response may vary between a 0 value and a maximum value, wherein this depends on the angle of the external magnetic field. Preferably, this dependence should be taken into account when processing the test signal, wherein the subsequent formulae indicate the connection between the geometric arrangement, i.e. the angular position of the external magnetic field to the magnetic field sensor element arrangement 200 and to the respective signal strength.

$$U_{OutTest} = E_{GMR\,min} V_{DD\,min} \sin(\alpha_{Test});$$

$$\alpha_{Test} = \arcsin \frac{U_{OutTest}}{E_{GMR\,min} V_{DD\,min}};$$

$$B_{Test\,max} = B_{ext} \tan(\alpha_{Test});$$

$$I_{Test} = \frac{B_{Test\,max}}{B_{1mA}},$$

with $U_{OutTest}$=test output voltage $I_{GMRmin}$=minimum sensitivity of the xMR sensor cell $V_{Ddmin}$=minimum supply voltage $\alpha_{Test}$=angular position between the external magnetic field and the xMR sensor cell $B_{Testmax}$=maximum test magnetic field strength $B_{ext}$=external magnetic field strength $B_{1mA}$=strength of the external magnetic field at a current strength of 1 mA in the current conductor structure 106.

From the above formulae, it becomes obvious that the maximum angle deviation achievable by the analog/digital converter input test voltage may be described therewith.

The analog/digital converter input test voltage is defined by the noise level, the test current admissible in operation, and the test time duration (low pass filtering). By inserting the subsequently illustrated values into the above formula, at a test output signal as small as −80 dB, a magnetic test field of about 9.8 µT results, which is obtained by a test current of about 300 µA (corresponding to the previously presented magnetic field sensor element arrangement 200 or the self-test arrangement 300).

In the special case of application of the magnetic field sensor element arrangement 200 or the self-test arrangement 300 illustrated on the basis of FIGS. 4 to 8, in which two bridge circuits standing orthogonal to each other provide test signals $V_X$, $V_Y$, the test signal sum $V_X+V_Y$ of both signal portions may be used as a functionality criterion regarding the magnetic field sensor element arrangement to be monitored. If one of the two bridge circuits 204, 206 fails, or one of the two bridge circuits 204, 206 works incorrectly, the integrated test signal sum will reduce and lead to an error message, depending on the adjusted threshold value.

Figure 8:
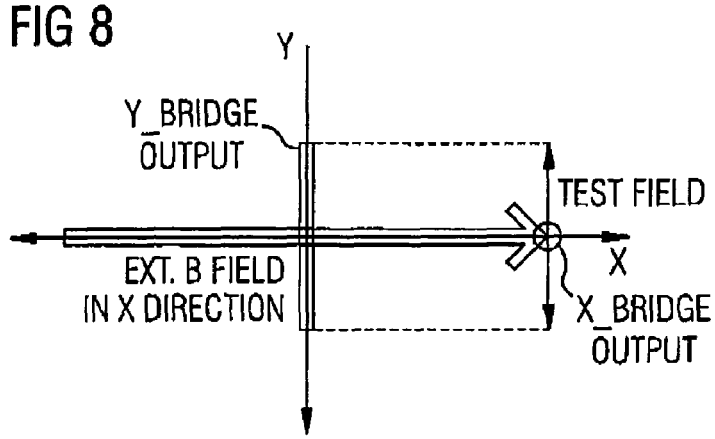
FIG. 8 shows a schematic illustration of the signal response to the test signal, depending on the angular position of the external magnetic field.
Figure 9:
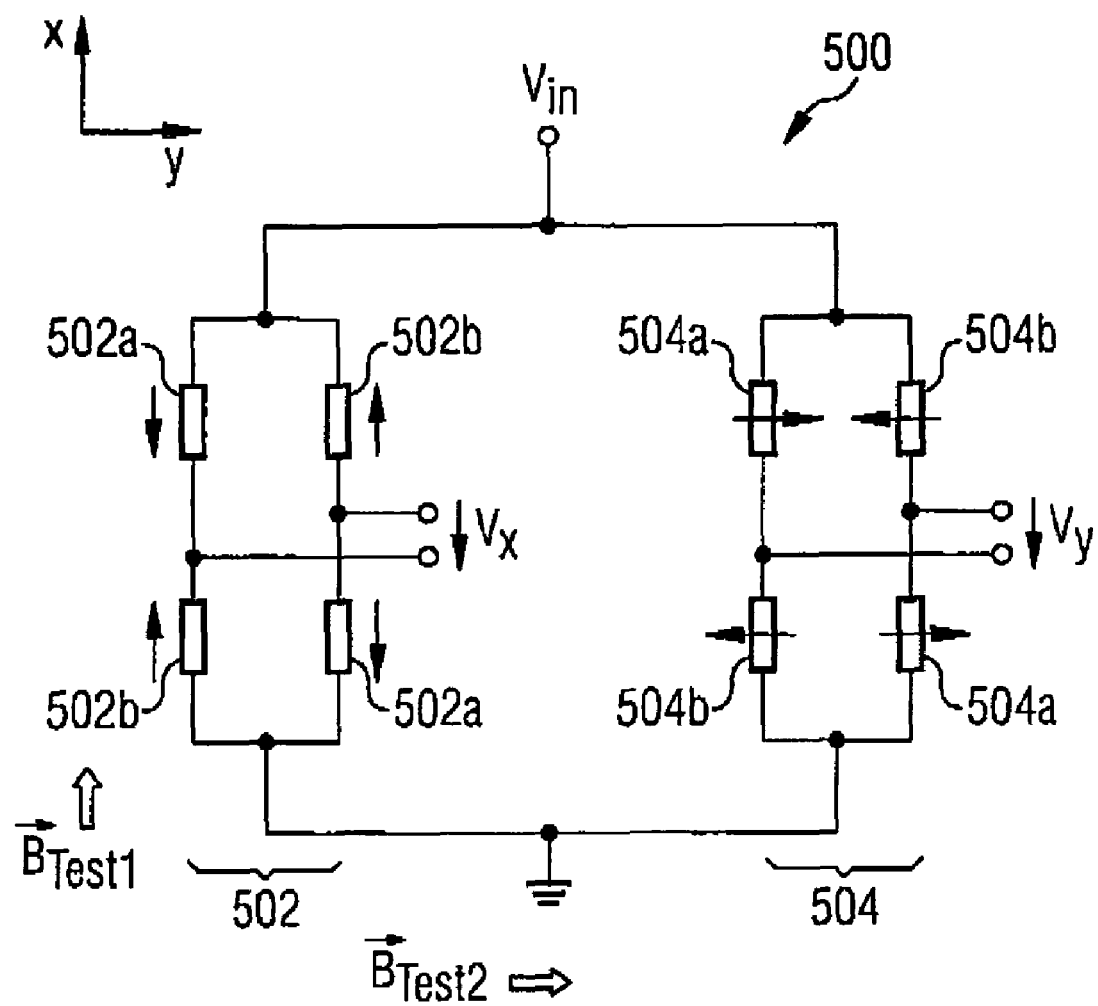
FIG. 9 shows a principle illustration of a double bridge circuit arrangement of a magnetoresistive sensor arrangement for angle determination of an external magnetic field according to the prior art.

The illustration shown in FIG. 8 exemplifies the vector summation of the magnetic field to be measured and the test signal. The illustration visualizes that, at the same test signal amplitude, its proportion in the vector sum is different.

In summary, it can now be stated that the inventive magnetic field sensor element or the inventive concept for manufacturing and examining the same comprises a series of advantages with reference to magnetoresistive sensor arrangements previously known in the prior art. The tests to be performed on the magnetic field sensor arrangement may now be performed immediately after the manufacture thereof, for example on wafer level or also as package. Furthermore, also with the same arrangement, online self-tests of the packages with the inventive magnetic field sensor elements already in operation may be made. Thus, the present invention enables simple functionality evaluation of the analog front end (AFE). Furthermore, a back end test is enabled, the system build-in at tier 1 and a test during the operation, e.g. at every start-up or online, of the sensor package. With reference to the sensor package tests, vast savings in test costs may be achieved, since no additional special equipment is required for performing the function tests, wherein particularly no external arrangement for generating an external measuring magnetic field has to be provided.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of performing an on-wafer function test comprising:
   providing a wafer with a plurality of magnetic field sensor elements arranged thereon, wherein each magnetic field sensor element comprises a magnetic-field sensitive structure and an associated current conductor structure, wherein the magnetic-field-sensitive structure has a magnetic-field-dependent electrical characteristic, and wherein each of the current conductor structures is formed to generate a predetermined test magnetic field component in the associated magnetic-field-sensitive structure;
   testing each magnetic-field-sensitive structure of the magnetic field sensor elements by:
      generating a test signal through each of the current conductor structures, to generate the predetermined test magnetic field component in the associated magnetic-field-sensitive structure;
      sensing a change in the electrical characteristic of the magnetic-field-sensitive structure due to the test magnetic field component; and
      evaluating the functionality of the magnetic field sensor element, based on the sensed change in the electrical characteristic of the magnetic-field-sensitive structure.

2. A method of claim 1, wherein the step of sensing a change comprises a sub-step of sensing an output signal of the magnetic-field-sensitive structure, wherein the output signal depends on the electrical characteristic of the magnetic-field-sensitive structure and the test signal.

3. A method of claim 2, wherein the step of evaluating further comprises a step of comparing the output signal dependent on the electrical characteristic and the test signal with a predetermined comparison value.

4. A method of claim 3, wherein reaching or exceeding the comparison value indicates a malfunction of the magnetic field sensor element, and under running the comparison value indicates a normal function of the magnetic field sensor element.

5. A method of claim 3, wherein reaching or under running the comparison value indicates a malfunction of the magnetic field sensor element, and exceeding the comparison value indicates a normal function of the magnetic field sensor element.

6. A method of claim 2, wherein the output signal further depends on an environment value, wherein the step of sensing the change further comprises a sub-step of determining the proportion of the output signal dependent on the electrical characteristic and the test signal.

7. A method of claim 6, wherein the step of determining the proportion of the output signal further comprises a sub-step of filtering out the signal portion due to the environment value.

8. A method of assembling magnetic field sensor elements with on-wafer function test, comprising the steps of:
   providing a substrate;
   arranging a plurality of permanently magnetizable magnetic field sensor structures on the substrate, wherein the permanently magnetizable magnetic field sensor structures have a magnetization minimum temperature;
   arranging a plurality of current conductor structures on the substrate, so that a current conductor structure is associated with each permanently magnetizable magnetic field sensor structure;
   generating local, permanent magnetization in each magnetic field sensor structure by:
      heating the permanently magnetizable magnetic field sensor structure to a temperature value above the magnetization minimum temperature; and
      generating a magnetization signal in the current conductor structure, to effect a defined magnetization magnetic field component in the permanently magnetizable sensor structure, so that permanent, local magnetization of the magnetic field sensor structure arises and the magnetic field sensor element with the permanently magnetized magnetic field sensor structure has a magnetic-field-dependent dependent electrical characteristic;
   testing each magnetic-field-sensitive structure of the magnetic field sensor elements by:
      generating a test signal through the current conductor structure, to generate a predetermined test magnetic field component in the magnetic-field-sensitive structure;
      sensing a change in the electrical characteristic of the magnetic field sensor structure due to the test magnetic field component; and
      evaluating the functionality of the magnetic field sensor element based on the sensed change in the electrical characteristic of the magnetic field sensor structure.

9. A method of claim 8, wherein the step of heating comprises a sub-step of generating a heating current signal through the current conductor structure.

10. A method of claim 9, wherein the sub-step of generating a heating current signal through the current conductor structure for heating the permanently magnetizable magnetic field sensor structure is performed so that the permanently magnetizable magnetic field sensor structure has a temperature value above the magnetization minimum temperature while generating the magnetization signal in the current conductor structure.

11. A magnetic field sensor element, comprising:

a permanently magnetizable magnetic field sensor structure with a first and a second sensor element contact, wherein the permanently magnetizable magnetic field sensor structure has permanent magnetization, and wherein a magnetic-field-dependent electrical characteristic of the magnetic field sensor structure is detectable via the sensor element contacts, and a current conductor structure with a first and a second current conductor contact, wherein the current conductor structure is formed so that a magnetization signal is applicable between the first and the second contact, to obtain a defined magnetization magnetic field component in the magnetic field sensor structure, in order to effect permanent, local magnetization of the magnetic field sensor structure, and so that also a test signal is applicable between the current conductor contacts, to obtain a defined test magnetic field component in the magnetic field sensor structure, wherein the current conductor structure is further formed so that a heating signal is applied between the first and the second contact, to raise the permanently magnetizable magnetic field sensor structure to a temperature value above the magnetization minimum temperature.

12. A magnetic field sensor element of claim 11, wherein the current conductor structure is formed and arranged with reference to the permanently magnetizable magnetic field sensor structure so as to generate a substantially homogeneous magnetic field in the permanently magnetizable magnetic field sensor structure.

13. A magnetic field sensor element, comprising:

a permanently magnetizable magnetic field sensor structure with a first and a second sensor element contact, wherein the permanently magnetizable magnetic field sensor structure has permanent magnetization, and wherein a magnetic-field-dependent electrical characteristic of the magnetic field sensor structure is sensed via the sensor element contacts, and a current conductor structure with a first and a second current conductor contact, wherein the current conductor structure is formed so that a magnetization signal is applied between the first and the second contact, to obtain a defined magnetization magnetic field component in the magnetic field sensor structure, in order to effect permanent, local magnetization of the magnetic field sensor structure, and so that also a test signal is applied between the current conductor contacts, to obtain a defined test magnetic field component in the magnetic field sensor structure.

wherein the permanently magnetizable magnetic field sensor structure has a width C2 and the associated current conductor structure has a width C1, wherein the width C2 of the magnetizable magnetic field sensor structure is smaller than or equal to the width C1 of the associated current conductor structure, and wherein the permanently magnetizable magnetic field sensor structure and the associated current conductor structure are arranged at a distance C3 from each other, wherein the distance C3 is smaller than about 20% and preferably smaller than 10% of the width C1 of the current conductor structure.

14. A magnetic field sensor element of claim 13, wherein the width C1 of the current conductor structure ranges from 2 to 25 μm.

* * * * *